(12) United States Patent
Gilmore

(10) Patent No.: US 8,420,554 B2
(45) Date of Patent: Apr. 16, 2013

(54) WAFER SUPPORT RING

(75) Inventor: Brian Lawrence Gilmore, Foristell, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 320 days.

(21) Appl. No.: 12/772,627

(22) Filed: May 3, 2010

(65) Prior Publication Data
US 2011/0269316 A1 Nov. 3, 2011

(51) Int. Cl.
*H01L 21/324* (2006.01)

(52) U.S. Cl.
USPC ............ 438/795; 438/907; 257/E21.497; 269/289 R

(58) Field of Classification Search ............ 438/795, 438/907; 257/E21.497; 269/289 R
See application file for complete search history.

(56) References Cited

U.S. PATENT DOCUMENTS

| | | | |
|---|---|---|---|
| 3,783,822 A | 1/1974 | Wollam | |
| 5,711,646 A | 1/1998 | Ueda et al. | |
| 6,109,677 A | 8/2000 | Anthony | |
| 7,033,168 B1 | 4/2006 | Gupta et al. | |
| 7,101,816 B2 | 9/2006 | Kaushal et al. | |
| 7,331,780 B2 | 2/2008 | Adachi | |
| 2004/0021097 A1 | 2/2004 | Preece | |
| 2008/0081111 A1 | 4/2008 | Carcasi | |
| 2008/0187416 A1 | 8/2008 | Hiroki et al. | |
| 2008/0272368 A1* | 11/2008 | Do et al. | 257/40 |
| 2010/0098519 A1 | 4/2010 | Shive et al. | |

FOREIGN PATENT DOCUMENTS

| | | |
|---|---|---|
| JP | 2006093283 A | 4/2006 |
| JP | 2008085206 A | 4/2008 |
| JP | 2009021368 A | 1/2009 |

OTHER PUBLICATIONS

PCT International Search Report and Written Opinion of the International Searching Authority mailed on Nov. 10, 2011 regarding PCT/IB2011/51775 filed on Apr. 22, 2011; 8 pages.

* cited by examiner

*Primary Examiner* — Zandra Smith
*Assistant Examiner* — Toniae Thomas
(74) *Attorney, Agent, or Firm* — Armstrong Teasdale LLP

(57) ABSTRACT

A wafer support ring and a method of using the same are disclosed herein. The support ring supports a wafer during a first processing operation. A top surface of the support ring is in contact with a first plurality of locations on a surface of the wafer during the first processing operation. A second wafer support structure is used to support the wafer during a second processing operation. A top surface of the second wafer support structure is in contact with a second, different plurality of locations on the surface of the wafer during the second processing operation. The wafer support ring may also have an outer lip disposed about an outer periphery of the support ring that has a depth such that it does not form part of the top surface of the support ring.

19 Claims, 8 Drawing Sheets

US 8,420,554 B2

WAFER SUPPORT RING

BACKGROUND

Semiconductor wafers are often subjected to high temperatures during heat treatment (e.g., annealing). However, during annealing the semiconductor wafers become more plastic and if they are not adequately supported they may undergo slip due to gravitational and thermal stresses. Slip may introduce contaminants into the semiconductor wafers and may also lead to damage to the wafers. Wafers are supported on wafer holder platforms (i.e., support rings) during annealing. These platforms typically contact the wafer only at specific points on the surface of the wafer, rather than on the entire surface of the wafer, and slip may occur at these contact points.

BRIEF SUMMARY

A first aspect is a method of supporting a wafer to prevent slip during a plurality of processing operations. The method comprises supporting a wafer during a first processing operation with a support ring, wherein the support ring has a top surface. The wafer is then transferred to a second wafer support structure after conclusion of the first processing operation. The wafer is then supported during a second processing operation with the second support structure, wherein the second support structure has a top surface. The wafer is in contact with the top surface of the support ring at a first plurality of locations on a surface of the wafer and the wafer is in contact with the top surface of the second support structure at a second plurality of locations on the wafer different than the first plurality of locations to prevent or inhibit slip.

Another aspect is an arcuate wafer support ring having a central opening, a top surface, and a bottom surface. The support ring comprises an inner contact area having a width of between 10 mm and 25 mm, the inner contact area defining at least a portion of the top surface of the support ring. A channel is disposed between the inner contact area and an outer periphery of the support ring, the channel having a width of between 25 mm and 40 mm. The support ring has an inner diameter of 200 mm and an outer diameter of 300 mm, and wherein the sum of the width of the inner contact area and the width of the channel is equal to 50 mm.

Still another aspect is an arcuate wafer support ring having a central opening, a top surface, and a bottom surface. The support ring comprises an inner contact area having a width and a thickness, the inner contact area defining at least a portion of the top surface of the support ring, an outer contact area having a width and a thickness, the outer contact area defining at least a portion of the top surface of the support ring, a channel disposed between the inner contact area and the outer contact area, the channel having a width and a depth, and an outer lip disposed radially outward from the outer contact area, the outer lip having a width and a depth less than the thickness of the outer contact area. The width of the inner contact area, the width of the outer contact area, the width of the channel, and the width of the outer lip are sized such that when supporting a wafer the top surface of the support ring contacts the wafer at locations different than locations contacted by a second wafer support structure in a second processing operation.

Still another aspect is a system for supporting a wafer during a plurality of processing operations. The system comprises a first wafer support structure and a second wafer support structure. The first wafer support structure is configured to support the wafer by contact with a top surface of the first wafer support structure and a surface of the wafer at first plurality of locations on the surface of the wafer. The second wafer support structure is configured to support the wafer by contact with a top surface of the second wafer support structure and the surface of the wafer at a second plurality of locations on the surface of the wafer, wherein at least one of the second plurality of locations is different than at least one of the first plurality of locations.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

DETAILED DESCRIPTION

Figure 1:
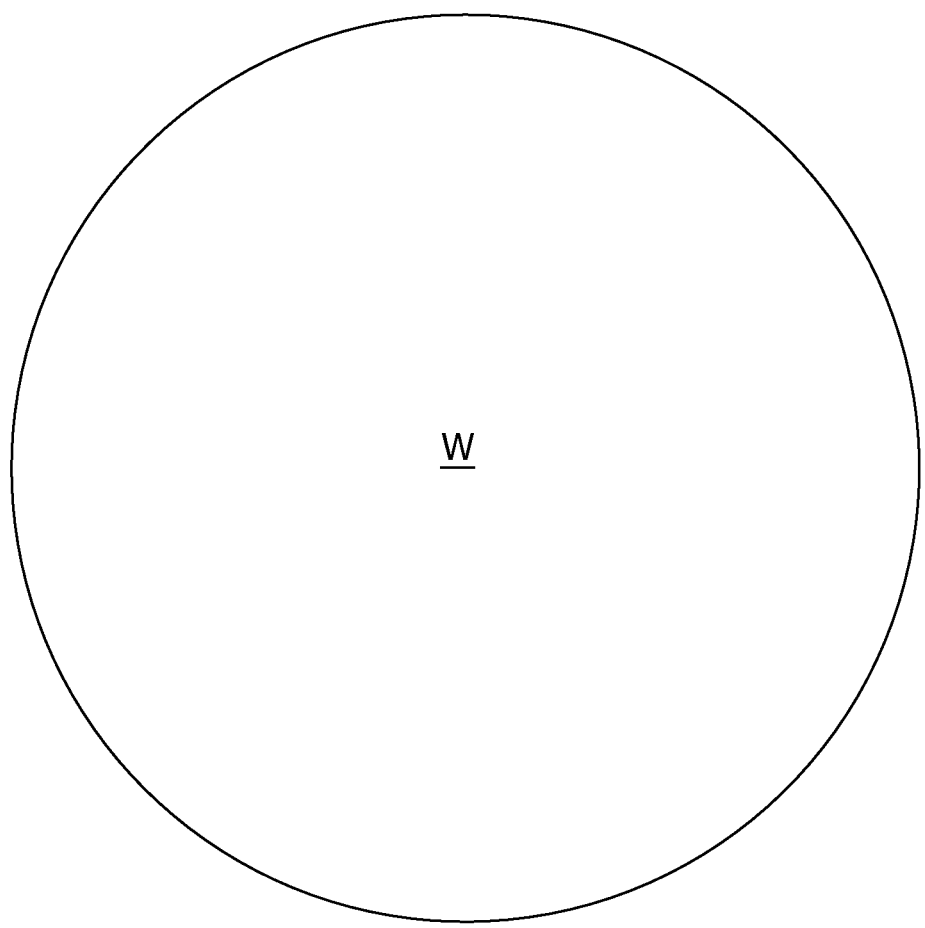
FIG. 1 is a top view of a wafer.
Figure 2:
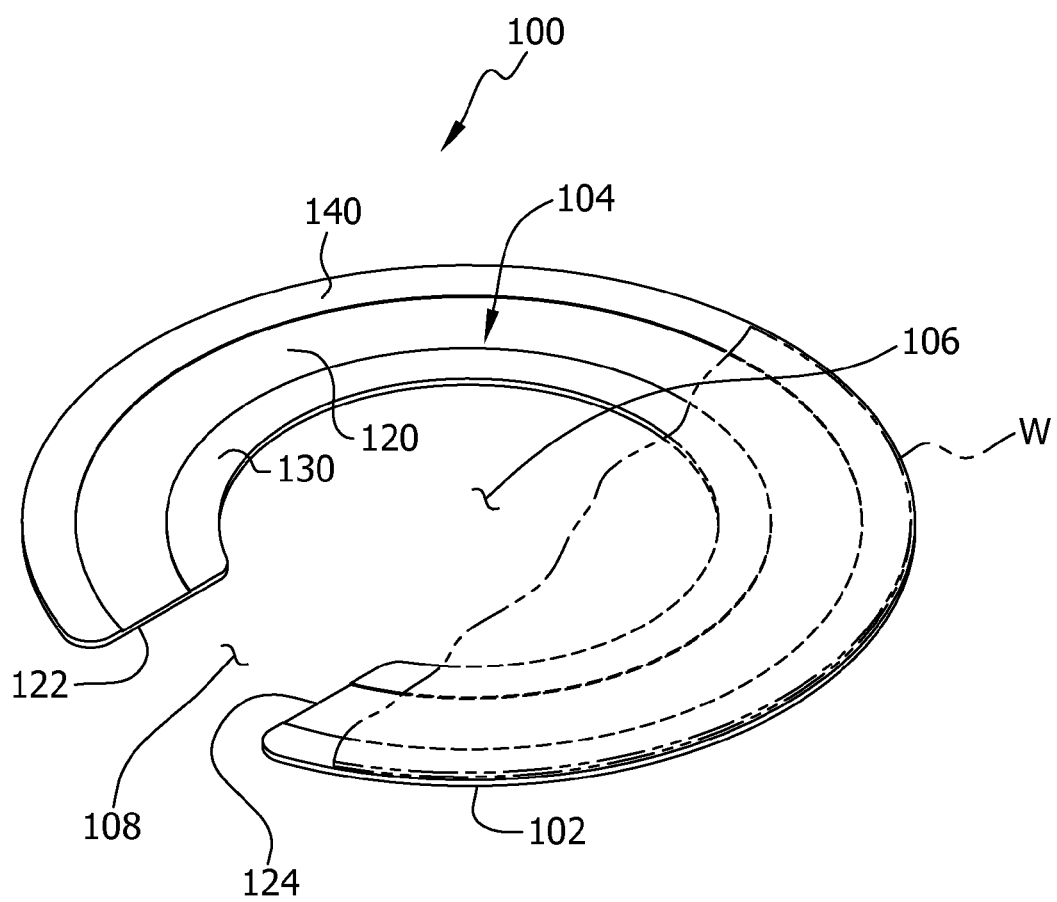
FIG. 2 is a perspective view of one embodiment of a support ring for supporting a wafer with portions of the wafer removed for clarity.

With reference now to the Figures, and in particular to FIGS. 1-4, a support ring (broadly, a "first wafer support structure") is generally indicated at 100. The support ring 100 is generally sized to support a semiconductor wafer such as a silicon wafer W. The wafer W may be a silicon-on-insulator (SOI) wafer according to some embodiments. A portion of the wafer W is shown in FIG. 2, while the wafer W is omitted from FIG. 3 and shown in phantom in FIG. 4. In some embodiments, the support ring 100 and wafer W are positioned in a vertical wafer boat (not shown) that is in turn positioned within a furnace during high temperature annealing of the wafer. A bottom surface 102 (FIG. 4) of the support ring 100 rests on fingers (not shown) or other support structures extending from the vertical wafer W boat while a top surface 104 supports the wafer thereon.

Figure 3:
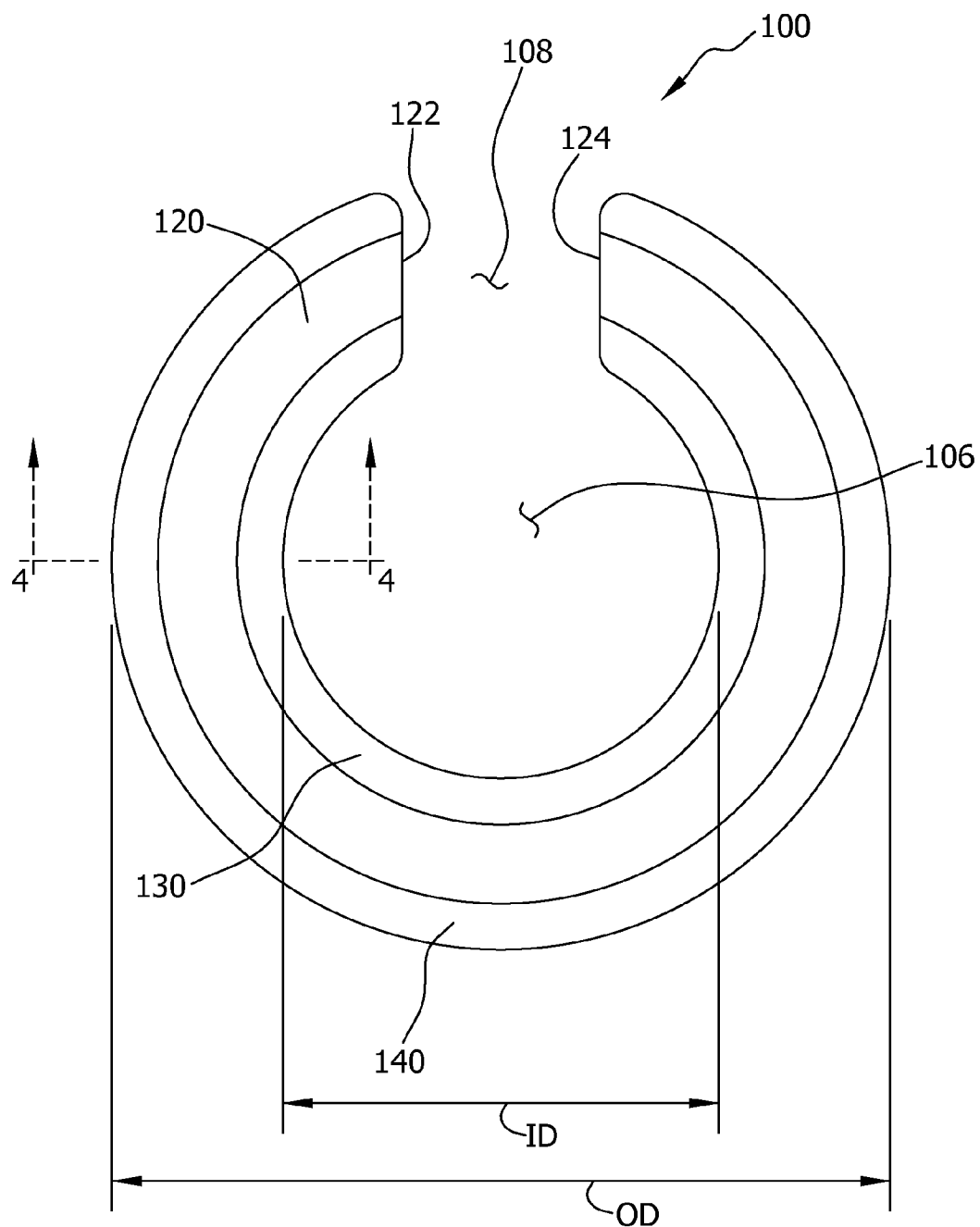
FIG. 3 is a top view of the support ring of FIG. 2.

The support ring 100 is generally arcuate in shape and has a central opening 106 and a radial opening 108 extending therefrom to an outer periphery of the support ring. The support ring 100 may be constructed from any suitable material, such as silicon carbide or silicon. The support ring 100 has an outer diameter OD, an inner diameter ID and a thickness T (FIG. 3). In some embodiments the thickness T of the support ring is 3 mm, while in other embodiments, the thickness is between 1 mm and 10 mm.

Figure 4:
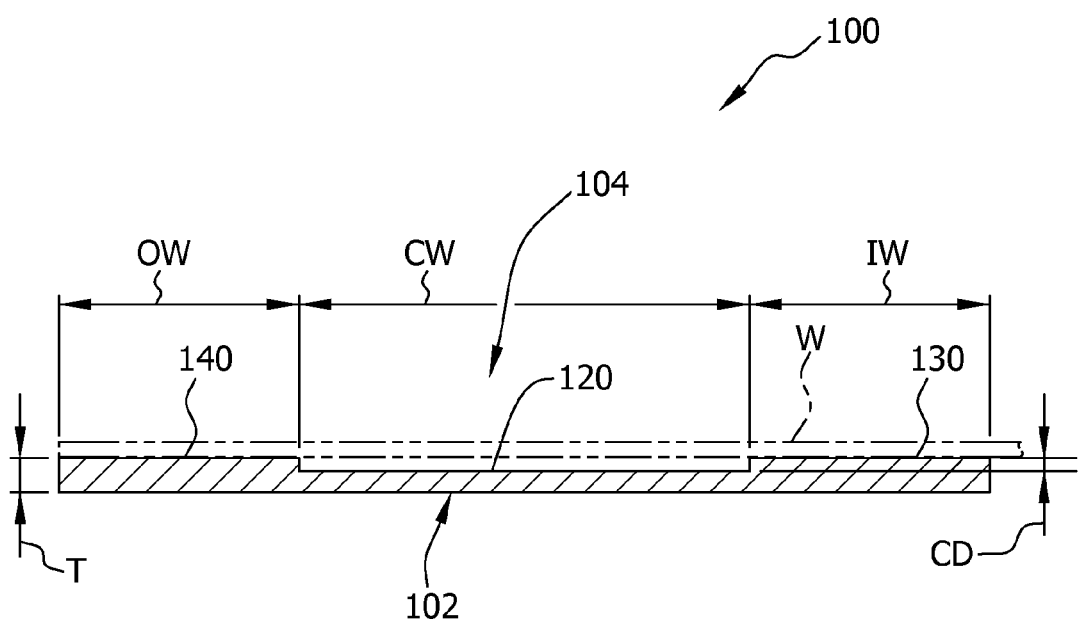
FIG. 4 is a cross-sectional view of the support ring of FIG. 3 taken along the 4-4 line.

As best seen in FIGS. 3 and 4, the support ring 100 has a channel 120 that is generally arcuate in shape and formed in the top surface 104 of the support ring. The channel 120 has opposing open ends 122, 124 that each extend through an opposing edge of the support ring 100 into the radial opening 108. The channel 120 also has a width CW and a depth CD, as shown in FIG. 3. The depth CD of the channel 120 is less than the thickness T of the support ring 100 and in some embodiments is 0.2 mm. In other embodiments, the depth CD of the channel 120 is any distance less than the thickness T of the support ring 100.

An inner contact area 130 is positioned radially inward from the channel 120 towards the central opening 106. The inner contact area 130 has a width IW. An outer contact area 140 is positioned radially outward from the channel 120 away from the central opening 106. The outer contact area 140 has a width OW. In some embodiments, the respective thicknesses of the inner contact area 130 and outer contact area 140 are equal to the thickness T of the support ring 100. In other embodiments, the respective thicknesses of the inner contact area 130 and the outer contact area are different than the thickness T of the support ring 100.

Figure 7:
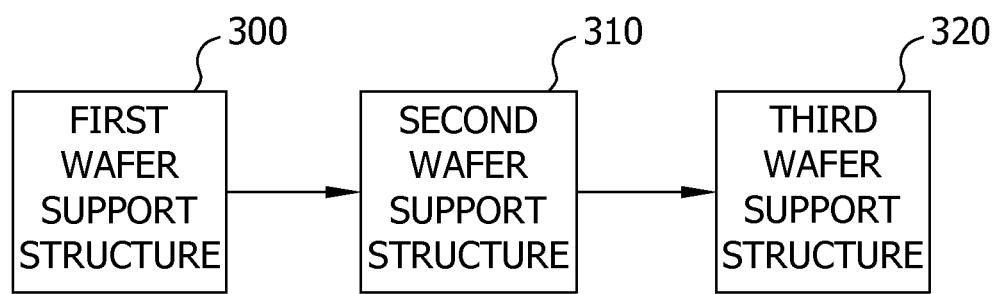
FIG. 7 is a schematic of a plurality of support rings.

As further described below, the width OW of the outer contact area 140, the width IW of the inner contact area 130, and the width CW of the channel 120 are each sized such that the top surface 104 of the support ring 100 contacts the wafer W at points on the wafer different than where the wafer is contacted at during other processing operations. For example, the support ring 100 is used in this embodiment to support the wafer W during a high-temperature heat treatment process (e.g., annealing). As shown in FIG. 7 the wafer W is supported during a first process by a first wafer support ring 300 (i.e., the support ring 100 or support ring 200) and is subsequently supported by a second wafer support structure 310 and third wafer support structure 320 during subsequent processing operations. The support ring 100 is thus configured such that these other support structures (i.e., the second wafer support structure 310 and the third wafer support structure 320) support the wafer at different locations than where the support ring contacts the wafer.

Without being bound to any particular theory, it is believed that contacting the wafer W at the same locations during multiple processing operations results in damage to the wafer at the points of contact. The damage may be due to increased thermal stresses at the points of contact between the wafer W and the support structure. This damage may also introduce slip into the wafer W and the points of contact may become nucleation points for other dislocations. By configuring the support ring 100 such that it contacts the wafer W at different locations than those locations on the wafer later in contact with the other support structures, the likelihood of damaging the wafer is significantly reduced.

Accordingly, in the embodiments of FIGS. 1-4 the inner diameter ID of the support ring 100 is 200 mm while the outer diameter OD is between 292 mm and 298 mm while the width OW of outer contact area 140 is 10 mm and the width IW of the inner contact area 130 is 10 mm. The width of the channel CW is 30 mm and the inner diameter ID of the support ring 100 is between 192 mm and 198 mm. The inner diameter ID and the outer diameter OD of the support ring are thus dependent on each other such that when the inner diameter is 192 mm the outer diameter is 292 mm and when the inner diameter is 198 mm the outer diameter is 298 mm. The support ring 100 is thus configured to contact the wafer W at locations (i.e., the inner contact area 130 and the outer contact area 140) on the top surface 104 of the wafer different than where the other support structures (i.e., the second wafer support structure 310 and the third wafer support structure 320) contact the wafer during subsequent processing operations.

In another embodiment, the inner diameter ID of the support ring 100 is 200 mm while the outer diameter OD is 300 mm and the outer contact area is not used. The width IW of the inner contact area 130 is between 10 mm and 25 mm while the width CW of the channel is between 25 mm and 40 mm. The width IW of the inner contact area 130 and the width CW of the channel 120 are thus dependent on each other such that when the width of the contact area is 10 mm the width of channel is 40 mm and when the width of the contact area is 25 mm the width of the channel is 25 mm.

Figure 5:
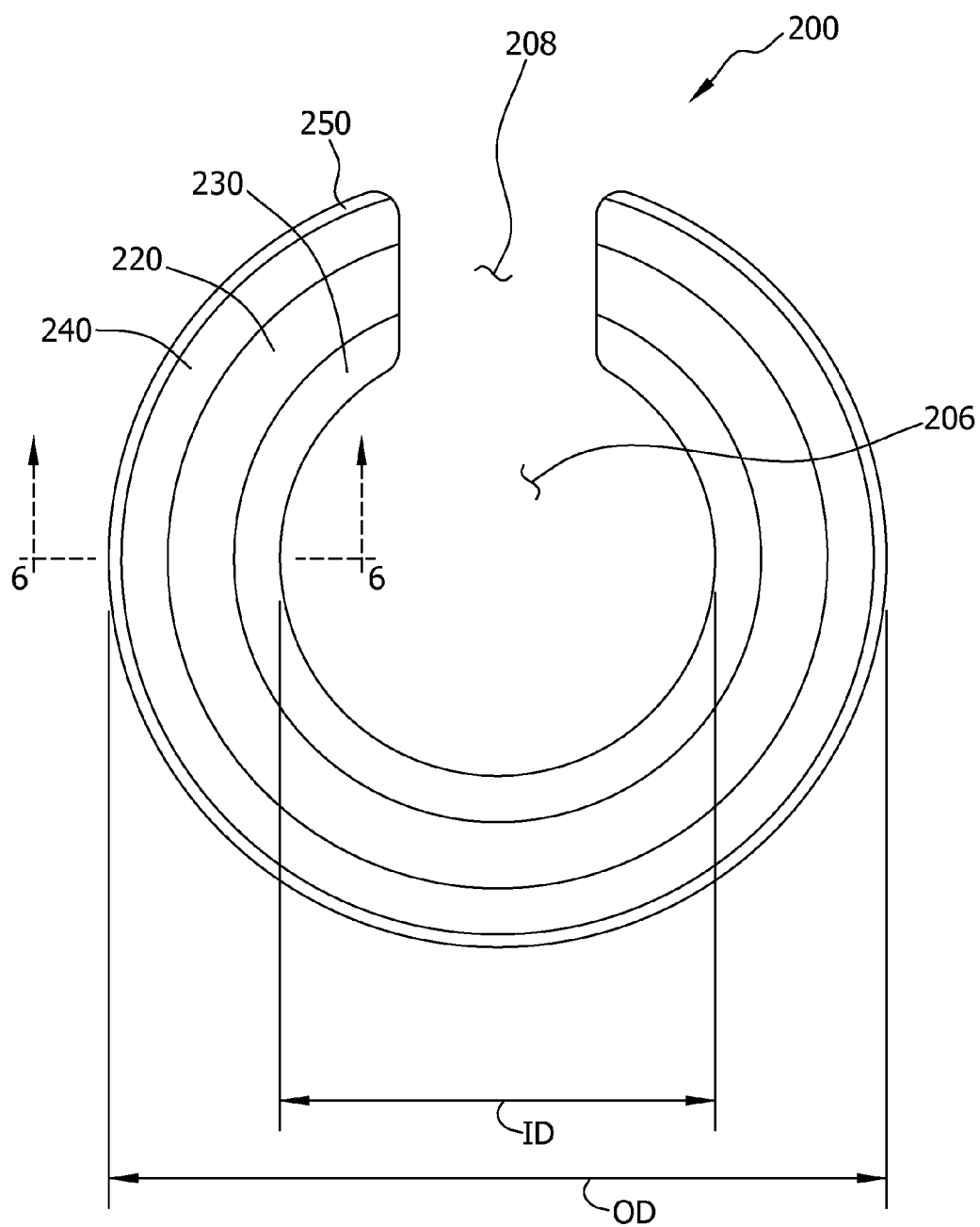
FIG. 5 is a top view of another embodiment of a support ring for supporting a wafer.
Figure 6:
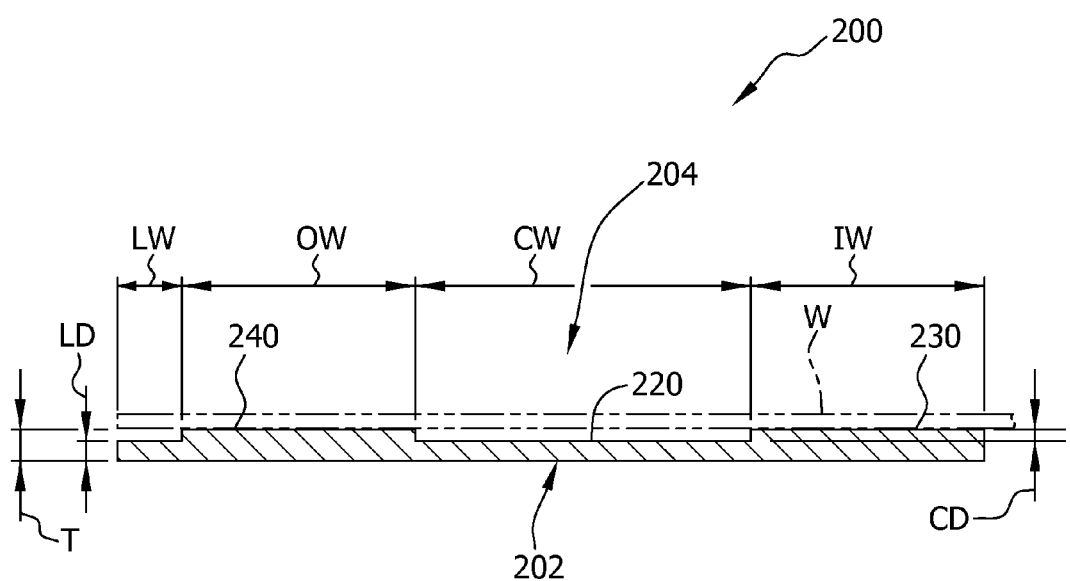
FIG. 6 is a cross-sectional view of the support ring of FIG. 4 taken along the 6-6 line.

FIGS. 5 and 6 show another embodiment of a support ring, indicated generally at 200. The wafer W is not shown in FIG. 5, and is instead shown in phantom in FIG. 6. The support ring 200 is similar to the support ring 100 described above and has similar components. The support ring 200 has a bottom surface 202, a top surface 204, a central opening 206, a radial opening 208, and a channel 220. The support ring 200 has an inner contact area 230, an outer contact area 240, and an outer lip 250, and opposite ends 222, 224. The support ring 200 has an inner diameter ID, an outer diameter OD, and a thickness T while the channel 220 has a channel width CW and a channel depth CD. The inner contact area 230 has a width IW, the outer contact area 240 has a width OW, and the outer lip 250 has a width LW and a depth LD. In some embodiments, the depth LD of the outer lip 250 is equal to the depth CD of the channel 220, although the two may be different without departing from the scope of the embodiments. Moreover, the thickness T of the support ring 200 is similar to or the same as the range of thicknesses described above in relation to the support ring 100. Likewise, the depth CD of the channel 220 is similar to or the same as range of depths described above in relation to the channel 120 of the support ring 100.

In the embodiment of FIGS. 5 and 6, the outer diameter OD of the support ring is 300 mm and the inner diameter ID is 200 mm. The width IW of the inner contact area 230 is 10 mm and the width OW of the outer contact area 240 is 10 mm. The width CW of the channel 220 is between 27 and 29 mm while the width LW of the outer lip 250 is between 3 mm and 10 mm. The width CW of the channel 220 and the width LW of the outer lip 250 are thus dependent on each other such that when the width of the channel is 27 mm the width of the outer lip is 3 mm and when the width of the channel is 29 mm the width of the outer lip is 1 mm. The support ring 200 is thus configured to contact the wafer W at locations (i.e., the inner contact area 230 and the outer contact area 240) on the top surface 204 that are different than where the other support structures (i.e., the second wafer support structure 310 and the third wafer support structure 320) contact the wafer during subsequent processing operations.

While the dimensions of the support rings 100, 200 described above are configured for supporting wafers having an outer diameter of 300 mm, the support rings may either be reduced or increased in size to accommodate wafers of smaller or larger diameters, respectively. As such the dimensions of the various portions of the support rings 100, 200 may be increased or decreased in a linear manner based on the outer diameter of the support rings. Moreover, the dimensions of the various portions of the support rings 100, 200 are exemplary in nature and should not be construed as limiting. Rather, the dimensions of the contact areas 130, 140, 230, 240, inner and outer diameters of the support rings 100, 200, and the outer lip 250 may be altered by any amount without departing from the scope of the embodiments such that the wafer W contacts the top surfaces 104, 204 of the support rings 100, 200 at locations different than where the wafer is contacted in subsequent operations (i.e., when supported by the second wafer support structure 310 or the third wafer support structure 320). In some embodiments, these subsequent processing operations may be thermal processes and by contacting the wafer W at one set of locations with the support rings 100, 200 and at another set of locations by other support structures, the likelihood of damage to the wafer is significantly reduced or eliminated.

Figure 8:
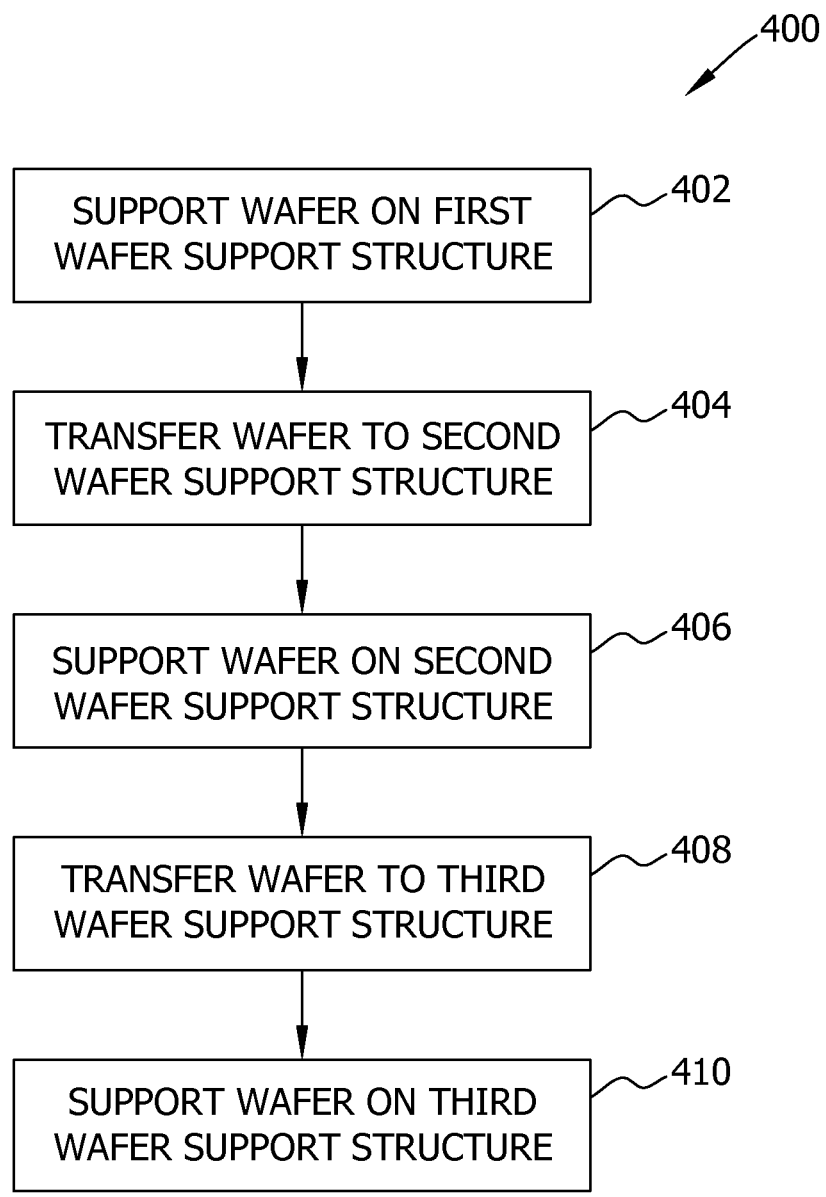
FIG. 8 is a flow diagram depicting a method of supporting a wafer with a plurality of different support rings.

With reference now to FIG. 8, a method 400 of supporting a wafer during a plurality of processing operations is disclosed. In some embodiments the processing operations are thermal processing operations, while in other embodiments the operations may be of other types. The method 400 begins at block 402 with supporting the wafer with either of the support rings 100, 200 (i.e., the first wafer support structure 300) and thereby contacting the wafer with the respective top surfaces 104, 204 at the inner contact areas 130, 230 and outer contact areas 140, 240 (broadly, a "first plurality of locations") during a first processing operation. After completion of the first processing operation, the wafer is transferred in block 404 to the second wafer support structure 310 which supports the wafer in block 406, and thereby contacts the wafer, during the second processing operation. The second wafer support structure 310 contacts the wafer at locations (broadly, a "second plurality of locations") on the surface of the wafer different than those at which the support rings 100, 200 contact the wafer (i.e., the first plurality of locations). After completion of this processing step, the wafer is transferred in block 408 to the third wafer support structure 320 which supports the wafer in block 410, and thereby contacts the wafer, during a third processing operation. The third wafer support structure 320 contacts the wafer at locations (broadly, a "third plurality of locations") on the surface of the wafer different than those at which the support rings 100, 200 contact the wafer. In some embodiments, the third wafer support structure 320 contacts the wafer at the same locations as the second wafer support structure 310. The wafer may continue to be transferred to subsequent wafer support structures at the conclusion of subsequent processing operations. In some embodiments, the support structures 310, 320 contact the wafer at the same locations, while in other embodiments, each of the support structures contact the wafer at different locations than any of the other support structures and the support rings 100, 200.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of the present invention or the embodiments thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawings shall be interpreted as illustrative and not in a limiting sense.

What is claimed is:

1. A method of supporting a wafer during a plurality of processing operations, the method comprising:
supporting a wafer during a first processing operation with a support ring, wherein the support ring has a top surface;
transferring the wafer to a second wafer support structure after conclusion of the first processing operation; and
supporting the wafer during a second processing operation with the second support structure, wherein the second support structure has a top surface;
wherein the wafer is in contact with the top surface of the support ring at a first plurality of locations on a surface of the wafer and the wafer is in contact with the top surface of the second support structure at a second plurality of locations on the wafer different than the first plurality of locations.

2. The method of claim 1 wherein the first processing operation is a thermal process.

3. The method of claim 1 wherein the second processing operation is a thermal process.

4. The method of claim 1 further comprising supporting the wafer at a third plurality of locations during a third processing operation.

5. The method of claim 4 wherein the third plurality of locations are different than the first plurality of locations.

6. The method of claim 4 wherein the third plurality of locations are different than the second plurality of locations.

7. The method of claim 4 wherein the third plurality of locations are the same as the second plurality of locations.

8. The method of claim 1 wherein the wafer is in contact with the support ring at one of a first contact area and a second contact area on the top surface of the support ring.

9. An arcuate wafer support ring having a central opening, a top surface, and a bottom surface, the support ring comprising:
an inner contact area having a width of between 10 mm and 25 mm, the inner contact area defining at least a portion of the top surface of the support ring; and
a channel disposed between the inner contact area and an outer periphery of the support ring, the channel having a width of between 25 mm and 40 mm;
wherein the support ring has an inner diameter of 200 mm and an outer diameter of 300 mm, and wherein the sum of the width of the inner contact area and the width of the channel is equal to 50 mm.

10. The support ring of claim 9 wherein the inner contact area has a width of 15 mm and the channel has a width of 35 mm.

11. The support ring of claim 9 wherein the inner contact area has a width 10 mm and the channel has a width of 40 mm.

12. The support ring of claim 9 further comprising an outer contact area having a width of between 1 mm and 10 mm, the outer contact area defining at least a portion of the top surface of the support ring.

13. The support ring of claim 12 wherein the sum of the width of the inner contact area, the width of the channel, and the width of outer contact area is equal to 50 mm.

14. The support ring of claim 12 wherein the outer contact area is disposed between the channel and the outer periphery of the support ring.

15. An arcuate wafer support ring having a central opening, a top surface, and a bottom surface, the support ring comprising:
an inner contact area having a width and a thickness, the inner contact area defining at least a portion of the top surface of the support ring;
an outer contact area having a width and a thickness, the outer contact area defining at least a portion of the top surface of the support ring;
a channel disposed between the inner contact area and the outer contact area, the channel having a width and a depth; and an outer lip disposed radially outward from the outer contact area, the outer lip having a width and a depth less than the thickness of the outer contact area;

wherein the width of the inner contact area, the width of the outer contact area, the width of the channel, and the width of the outer lip are sized such that when supporting a wafer the top surface of the support ring contacts the wafer at locations different than locations contacted by a second wafer support structure in a second processing operation.

16. The support ring of claim 15 wherein the locations at which the top surface of the support ring contacts the wafer when supporting the wafer are different than locations contacted by a third wafer support structure in a third processing operation.

17. The support ring of claim 15 further comprising a radial opening extending from the central opening to an outer periphery of the support ring.

18. A system for supporting a wafer during a plurality of processing operations, the system comprising:

a first wafer support structure configured to support the wafer by contact between a top surface of the first wafer support structure and a surface of the wafer at a first plurality of locations on the surface of the wafer; and a second wafer support structure configured to support the wafer by contact between a top surface of the second wafer support structure and the surface of the wafer at a second plurality of locations on the surface of the wafer, wherein all of the second plurality of locations are different than all of the first plurality of locations.

19. The system of claim 18 further comprising a third wafer support structure configured to support the wafer by contact with a top surface of the third wafer support structure and the surface of the wafer at a third plurality of locations, wherein at least one of a third plurality of locations is different than at least one of the first plurality of locations.

* * * * *